United States Patent
Guim Bernat et al.

(10) Patent No.: US 10,241,885 B2
(45) Date of Patent: Mar. 26, 2019

(54) SYSTEM, APPARATUS AND METHOD FOR MULTI-KERNEL PERFORMANCE MONITORING IN A FIELD PROGRAMMABLE GATE ARRAY

(71) Applicant: Intel Corporation, Santa Clara, CA (US)

(72) Inventors: Francesc Guim Bernat, Barcelona (ES); Karthik Kumar, Chandler, AZ (US); Thomas Willhalm, Sandhausen (DE); Daniel Rivas Barragan, Cologne (DE); Patrick Lu, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 15/460,385

(22) Filed: Mar. 16, 2017

(65) Prior Publication Data

US 2018/0267878 A1    Sep. 20, 2018

(51) Int. Cl.
*G06F 11/34* (2006.01)
*G06F 11/30* (2006.01)
*H03K 19/177* (2006.01)

(52) U.S. Cl.
CPC ...... *G06F 11/3409* (2013.01); *G06F 11/3017* (2013.01); *H03K 19/1776* (2013.01); *H03K 19/17764* (2013.01)

(58) Field of Classification Search
CPC .......... G06F 11/3409; G06F 11/3017; H03K 19/1776; H03K 19/17764
USPC ............ 702/179, 182; 717/126, 161, 172; 700/174
See application file for complete search history.

(56) References Cited

U.S. PATENT DOCUMENTS

| | | | |
|---|---|---|---|
| 2012/0084759 A1* | 4/2012 | Candea | G06F 11/3612 717/126 |
| 2013/0158879 A1* | 6/2013 | Hu | A61N 5/1031 702/19 |
| 2016/0283278 A1 | 9/2016 | Duran Gonzalez et al. | |
| 2017/0031681 A1 | 2/2017 | Ould-Ahmed-Vall et al. | |

\* cited by examiner

*Primary Examiner* — John H Le
(74) *Attorney, Agent, or Firm* — Trop, Pruner & Hu, P.C.

(57) ABSTRACT

In one embodiment, a field programmable gate array (FPGA) includes: programmable logic to perform at least one function for a processor coupled to the FPGA; a performance monitor circuit including a set of performance monitors to be programmably associated with a first kernel to execute on the FPGA; and a monitor circuit to receive kernel registration information of the first kernel from the processor and program a first set of performance monitors for association with the first kernel based on the kernel registration information. Other embodiments are described and claimed.

20 Claims, 9 Drawing Sheets

SYSTEM, APPARATUS AND METHOD FOR MULTI-KERNEL PERFORMANCE MONITORING IN A FIELD PROGRAMMABLE GATE ARRAY

TECHNICAL FIELD

Embodiments relate to performance monitoring within a field programmable gate array.

BACKGROUND

The pace of technology advancements, particularly in the area of computing technology, continues to increase. In this environment, system debug has become one of the main challenges in understanding and characterizing systems, and performing root cause analysis for failures, performance concerns and so forth. Debug is becoming increasingly important as systems become more complex, making software and system bottlenecks harder to discern.

In many computing environments, field programmable gate arrays (FPGAs) are becoming a de facto technology to accelerate execution for specific parts of a software stack. These FPGAs can be used in many different cases, such as in enterprises, communications, and cloud-based workloads that benefit from offloading certain portions of a workload. For example, a communications workload may offload software components (such as virtual switches) to FPGAs. Existing performance monitoring capabilities are not suitable to adequately analyze such workloads.

DETAILED DESCRIPTION

Figure 1:
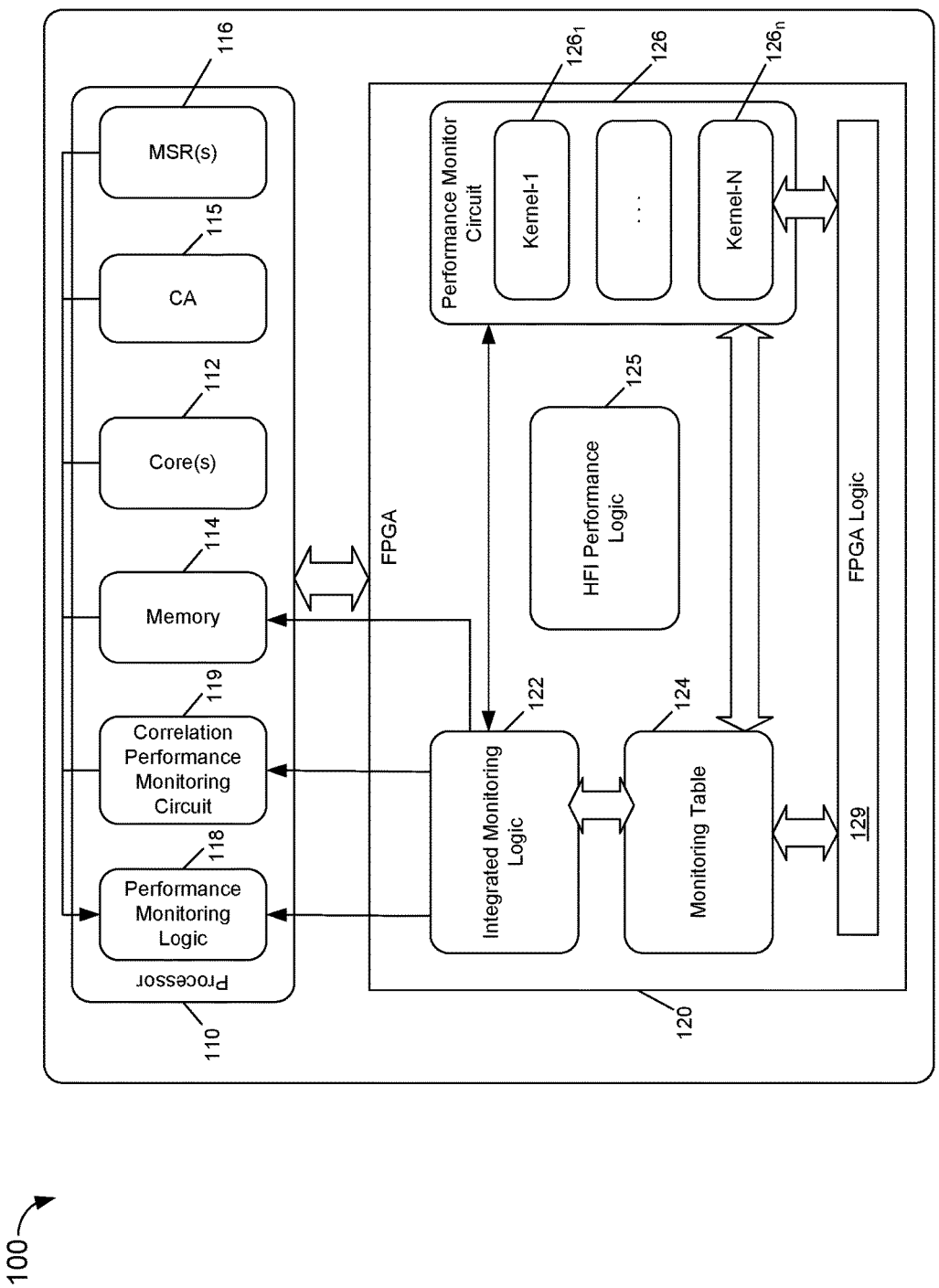
FIG. 1 is a block diagram of a processing node in accordance with an embodiment of the present invention.

In various embodiments, integrated performance monitoring circuitry may be provided within a field programmable gate array (FPGA). More specifically, this performance monitoring circuitry can be programmable by incoming kernels or bitstreams that are used to program the FPGA. In this way, this performance monitoring circuitry can be dynamically programmed for a given kernel in execution on the FPGA. As used herein, the term "kernel" is used to refer to code provided, e.g., by way of a serial bitstream, to a FPGA to enable programming and/or configuration/re-configuration of the FPGA. Understand that a kernel further may include executable code to be executed on the FPGA as configured. However, understand that the term "kernel" as used herein does not refer to an operating system or other code base for execution on a host processor.

In addition, embodiments provide interface techniques to enable this FPGA performance monitoring circuitry to be readily accessible to a host processor with which the FPGA is associated. In particular embodiments described herein, a node arrangement for, e.g., server computers of a datacenter, may use the integrated performance monitoring circuitry. Such nodes may include one or more processors such as multicore processors each associated with at least one FPGA. In some cases, these nodes may be implemented as multi-chip modules (MCMs) in which a single package includes at least one multicore processor and at least one FPGA. With this arrangement, embodiments enable applications that execute on the host processor to readily interact with the performance monitoring information made available by way of these FPGA-integrated performance monitors.

With the integration realized using an embodiment of the present invention, performance information regarding interaction between processor and FPGA can be obtained. For example, a kernel may program the dynamic performance monitors of the FPGA to debug activity specific to a FPGA (and its interaction with a processor), such as how software is using the FPGA and interacting with the FPGA from the processor. As an example, FPGA-specific events can be defined by an application specific to its usage. For example, FPGA-gate specific timings and/or FPGA-specific communication between two sets of gates can be monitored. Still further examples may include monitoring regarding the number of cycles spent in each state of a finite state machine running on the FPGA, or queue depths related to the FPGA. In all of these scenarios, without an embodiment, the application would not have any insight regarding how its software is running on the FPGA.

As a still further example use case, consider an application that is running on both processor and FPGA, where data/control flow involves several exchanges/communications between the processor and the FPGA. With FPGA dynamic performance monitoring as described herein, monitored information may be analyzed to identify a given exchange/communication that is bottlenecked, leading to stalled dependencies on the FPGA.

Thus using an embodiment actual execution and interaction between a FPGA and processor can be monitored and analyzed. Still further, with programming by a kernel, kernel-specific events that are custom defined for the kernel can be monitored based on the kernel's registration of performance monitors and metadata for the performance monitors. Embodiments also enable monitored information to be observed and monitored from the processor side via interfaces described herein. In this way, as the processor is the agent that provides the control flow for execution (and therefore can take corrective action), suitable information can be obtained and analyzed to effect corrective action. As an example based on the monitored information, work could be redistributed between the processor and FPGA if it is determined that execution on the FPGA is bottlenecked, or vice versa.

In various embodiments, one or more kernels in execution on the FPGA can configure (populate) a set of multiplexed generic performance monitors (e.g., performance counters) within the FPGA. In this way, an application in execution on an associated compute node can access transparently these dynamic performance monitors within the FPGA that are specific to each kernel (and which can be dynamically programmed whenever a new kernel is deployed to the FPGA).

To this end, embodiments provide a set of interfaces to extend a processing node architecture (including at least a processor and an FPGA, which may be coupled via a coherent interconnect) to enable kernels to expose specific performance monitors to one or more applications in execution in the processing node. Such interfaces enable a kernel to dynamically register performance monitors within the FPGA and their corresponding metadata.

In a particular embodiment, multiple interfaces are provided to enable interaction between FPGA and processor as described herein. More specifically, a first interface may be used to enable a kernel to be registered with one or more FPGA performance monitors and to further identify how the kernel performance monitor data is to be exposed. In an embodiment such interface may be provided to allow a customer to register a kernel by providing a pointer to a memory region where the FPGA can store performance monitoring information obtained from the FPGA dynamic performance monitors being registered and updated with the given kernel. Alternately, the registration can specify that performance monitors within the processor may be used to access the performance monitoring information. A second interface may be used by the kernel to associate the registered performance monitors with its corresponding metadata. A third interface may be used by the kernel during execution to update a specific performance monitor in response to occurrence of an event. A fourth interface may be used by an application in execution on the processor to discover the performance monitors exposed by a given kernel. More specifically, a software stack in execution on the processor can discover any programmed performance monitors and enable access to data within such performance monitors (e.g., via memory access or correlation performance monitors within the processor itself). These various monitors are described in a representative processor arrangement in FIGS. 1 and 2.

Referring now to FIG. 1, shown is a block diagram of a processing node in accordance with an embodiment of the present invention. In examples, processing node 100 may be one processing node of a multi-processing node computer system such as a server system. As an example, multiple nodes (e.g., implemented similarly to node 100) may be adapted on one or more rack-mounted servers. Of course understand that a given server includes additional hardware components including one or more additional processors, memories, mass storage, communication circuits and so forth.

With reference to FIG. 1, processing node 100 includes a host processor 110 which in an embodiment may be implemented as a central processing unit (CPU) such as a multi-core processor. In a particular example, host processor 110 may take the form of an Intel® XEON® or an Intel® Core™ processor. In other cases, host processor 110 may be an accelerated processing unit (APU) or a graphics processing unit (GPU). Processing node 100 further includes a FPGA 120. In some embodiments, processing node 100 may be implemented within a single package such as within a multi-chip module in cases where host processor 110 and FPGA 120, each formed on a different semiconductor die, are implemented within a single package. In other cases, host processor 110 and FPGA 120 may be implemented within separate packages. In still further embodiments, it is possible for host processor 110 and FPGA 120 to be implemented on a single semiconductor die. In any event, processing node 100 is provided with programmable performance monitoring circuitry within FPGA 120 to enable monitoring of operation within FPGA 120 and communication of monitored information to applications executing on host processor 110 in an efficient manner.

At the high level shown in FIG. 1, host processor 110 includes one or more cores 112. In many cases, host processor 110 is a multi-core processor where multiple processing cores are provided. In some cases a set of homogeneous processing cores may be present, while in other cases a mix of heterogeneous processing cores, such as combinations of processing cores having different power consumption levels, different micro-architectures (such as a mix of in-order and out-of-order cores), or so forth may be present. In addition to cores 112, host processor 110 includes a memory 114 that may be implemented as one or more cache memory hierarchies. In addition one or more caching agents (CA) 115 are present. In general, CA 115 is a coherency agent within a node that processes memory requests from cores 112 within a given node. Although not shown, understand that processor 110 further may include a home agent that is a node cluster to process memory requests from CA 115 and act as a home for part of a memory address space. Note in this regard that a single semiconductor die may include multiple homes having distributed address space mapping. Depending upon address space of a given request, the request may be provided to a local node's memory, via a unified path interconnect (UPI) or other agent to route the request to another processor within a single coherent domain. Or the request may be communicated outside the coherent domain via a host fabric interface (HFI) or other fabric interconnection. Note that multiple processors connected via a UPI may be located within a single coherent domain. As such, embodiments may be used in a distributed shared memory fabric-connected system without hardware cache coherence.

A given system may be formed of one or more coherent domains. For example, in high performance computing (HPC) or data center implementations, multiple clusters or servers can communicate using a fabric. In this way, each coherent domain can expose some address regions to other coherent domains. Such fabric may perform mapping of addresses of memory ranges between different coherent domains. Thus in an embodiment, it may be possible for FPGA-based performance monitors to be exposed beyond a single coherent domain.

Still with reference to host processor 110, a performance monitoring logic 118 is present. This performance monitoring logic may include combinations of hardware circuitry, software and/or firmware. In some embodiments, performance monitoring logic 118 may include control circuitry and a set of performance monitors to monitor performance within host processor 110. These performance monitors may include one or more sets of counters. Such counters may include dedicated counters to count particular events within the processor, such as cache memory misses, instruction execution rates, cycle counters and so forth. While these performance monitors may be suitable for monitoring performance within cores 112 and potentially other portions of host processor 110, they may not be well-suited for monitoring performance within FPGA 120.

To enable interaction and efficient communications with performance monitoring circuitry within FPGA 120, host processor 110 may further include a correlation performance monitoring circuit 119. As will be described herein, correlation performance monitoring circuit 119 may be configured to receive monitored information from corresponding performance monitors within FPGA 120. In an embodiment, correlation performance monitoring circuit 119 may be implemented as a single dedicated fixed performance monitor to be multiplexed for storing and representing performance monitoring information from a given one of performance monitors within FPGA 120. In other cases this circuit may include multiple performance monitors to be multiplexed. In other cases, the correlation performance monitoring circuit may be optional, and performance monitors within performance monitoring logic 118 may be configured to receive monitored information from corresponding performance monitors within FPGA 120.

To enable an application that executes on host processor 110 to contemplate the dynamic programming of performance monitors within FPGA 120, one or more machine specific registers (MSRs) 116 may be present. Such MSRs 116 may be written in connection with FPGA performance monitor programming to provide information as to the kernel that programmed the performance monitors and metadata associated with the performance monitors. The software stack, upon registering a given kernel in FPGA 110, may receive a kernel ID that can be used to identify what performance monitors it can access (e.g., KERN1_PMON4). On the other hand, to discover the semantics and characteristics of each kernel performance monitor, the application can access MSRs 116 to expose this information.

In an embodiment, MSRS 116 may take the form of: MSR_KERN1_PMON1, MSR_KERN1_PMON2, . . . , MSR_KERN1_PMONn, MSR_KERNm_PMONp. More specifically, MSRs 116 may be used to expose metadata associated with the dynamic performance monitors within FPGA 120 so applications in execution on processor 110 can discover how many performance monitors a kernel exposes, what they are and how they are updated.

Still referring to FIG. 1, FPGA 120 includes FPGA logic 129. Such logic may be programmable under control of one or more kernels or bitstreams to programmably reconfigure the circuitry of FPGA 120 for desired uses. Because of the programmability of the logic within FPGA 120, dedicated performance monitors for monitoring operation and execution within FPGA 120 may not be suitable or sufficient for at least certain uses. Nonetheless, in some embodiments FPGA 120 may include a host fabric interface (HFI) performance monitor logic 125 which may include one or more dedicated performance monitors that can monitor predetermined events within FPGA 120. Examples of these dedicated monitors include monitors to track the data traffic to the FPGA, memory bandwidth used by the FPGA, network traffic, power consumed by the FPGA, as such events can be predetermined since they do not depend on any specifics of a kernel that runs on the FPGA.

In addition, to provide a high level of dynamic programmability for performance monitoring within FPGA 120, an integrated monitoring logic 122 (also referred to herein as "monitoring logic") is present. In embodiments, integrated monitoring logic 122, which may be implemented as hardware circuitry, software and/or firmware or combinations thereof, is configured to receive information from multiple kernels that may execute in parallel within FPGA 120. Based upon kernel programming, particular performance monitors within a performance monitoring circuit 126 may be dynamically allocated to particular kernels.

In the embodiment shown in FIG. 1, performance monitoring circuit 126 includes a fixed plurality or sets of performance monitors $126_1$-$126_n$. Each of these sets of performance monitors may be dynamically allocated to a given kernel. Understand that the number of sets (and in turn, the number of performance monitors within each set) may vary depending upon implementation. Furthermore, understand that the number of performance monitors within each set also may vary, but may, in some embodiments, be fixed upon design. Note that as used herein, the terms "performance monitor" and "performance counter" are used synonymously to refer to a hardware circuit configured to monitor and store information associated with operation of a circuit. In different cases, these performance monitors or counters may be configured to store count information associated with particular events that occur, execution rates, cache misses, particular operations performed, among a wide variety of other performance monitoring information types.

Integrated monitoring logic 122 also may, based upon registration information received from a kernel, store information within a monitoring table 124. As will be described herein, monitoring table 124 is configured to store a variety of different information types associated with multiple kernels and the dynamic performance monitoring circuitry allocated to these kernels. More specifically, monitoring table 124 may be used to register a given amount of performance monitors and corresponding metadata by a kernel.

In addition as described herein, integrated monitoring logic 122 is configured, based on the metadata (e.g., update counter every N cycles or on overflow) to use interfaces to communicate the monitored information present within one or more of performance monitors 126 to an application in execution on processor 110. As described herein, different interfaces for communication of performance monitoring information may be present in different embodiments. In many embodiments, there may be multiple interfaces, including an interface directly to a memory. While this interface in FIG. 1 is shown as a coupling between monitoring logic 122 and cache memory 114, in some cases this interface to provide monitored information may instead be directly to a system memory coupled to or within processing node 100 (such as a dynamic random access memory). Another interface may provide for direct communication of monitored information from monitoring logic 122 to performance monitor logic 118 within processor and/or correlation performance monitor circuit 119. These different interface paths for communication of monitored information may be activated based on information present in monitoring table 124. Understand while shown at this high level in the embodiment of FIG. 1, many variations and alternatives are possible. For example, a given processing node may include multiple processors and FPGAs.

Figure 2:
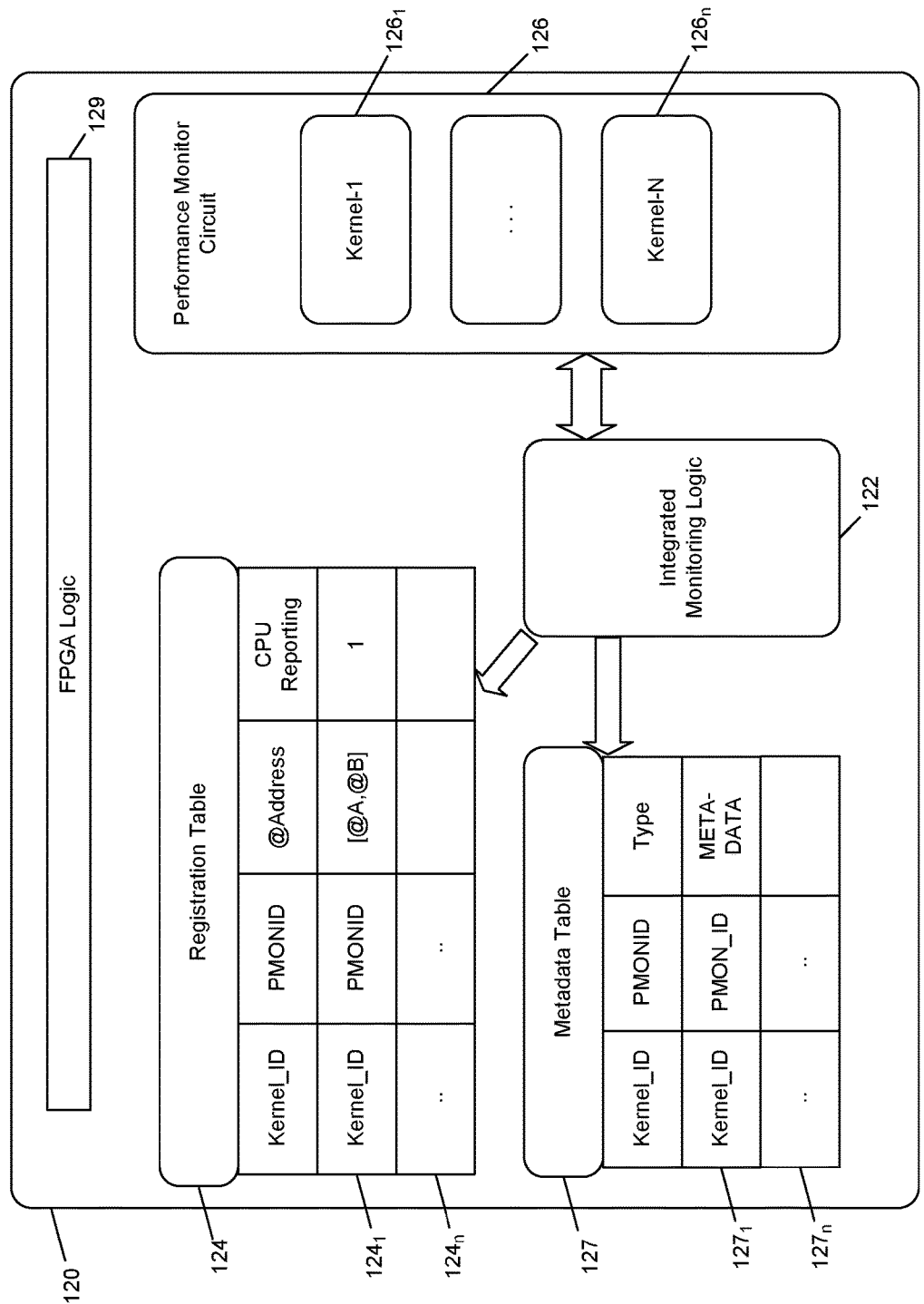
FIG. 2 is a block diagram illustrating further details of an FPGA in accordance with an embodiment of the present invention.

Referring now to FIG. 2, shown is a block diagram illustrating further details of an FPGA in accordance with an embodiment of the present invention. As illustrated in FIG. 2, integrated performance monitoring logic 122 may receive registration information from multiple kernels and use this information both to dynamically allocate performance monitoring resources within performance monitor circuit 126, and register information associated with this dynamic allocation within registration table 124 and a separate metadata table 127 (which may collectively correspond to monitoring table 124 of FIG. 1). Monitoring logic 122 may operate, based on metadata (e.g., update counters every N cycles or on overflow) and programming, to update a memory range with monitored data. Note that applications in execution on processor 110 may access metadata stored in metadata table 127 to discover what performance monitors are exposed, what they contain and how will be updated. In some cases, access to this metadata may be predicated on a security protocol such that a given application is allowed access if it has appropriate security rights. In an embodiment, a system administrator determines such rights, which may be based on operating system/hypervisor privilege groups. For example, a root may be provided full access, while certain virtual machines may have limited access.

In an embodiment, the performance monitor identifiers can take the form of: KERN1_PMON1, KERN1_PMON2, . . . , KERN1_PMONn, . . . , KERNm_PMONp, to indicate given kernels and associated performance monitors within performance monitor circuit 126. Note that both "n" and "p" can be implementation specific. Understand while two separate tables are shown for ease of illustration in FIG. 2, embodiments are not limited in this regard. For example, in other cases a single monitoring table may be used to store the information included in registration table 124 and metadata table 127.

As seen, registration table 124 may include a plurality of entries $124_1$-$124_n$. Each entry may include a plurality of fields to store information associated with a particular performance monitor allocated to a given kernel. Thus as seen, entry $124_1$ includes a kernel identifier field to identify a particular kernel, a performance monitor field to identify a particular performance monitor dynamically allocated to this kernel, an address field to store address information, and an enable field to indicate whether CPU-based performance monitoring circuitry is to be used in connection with this performance monitor. The address field may be used to store an address, e.g., in a system memory.

Figure 3:
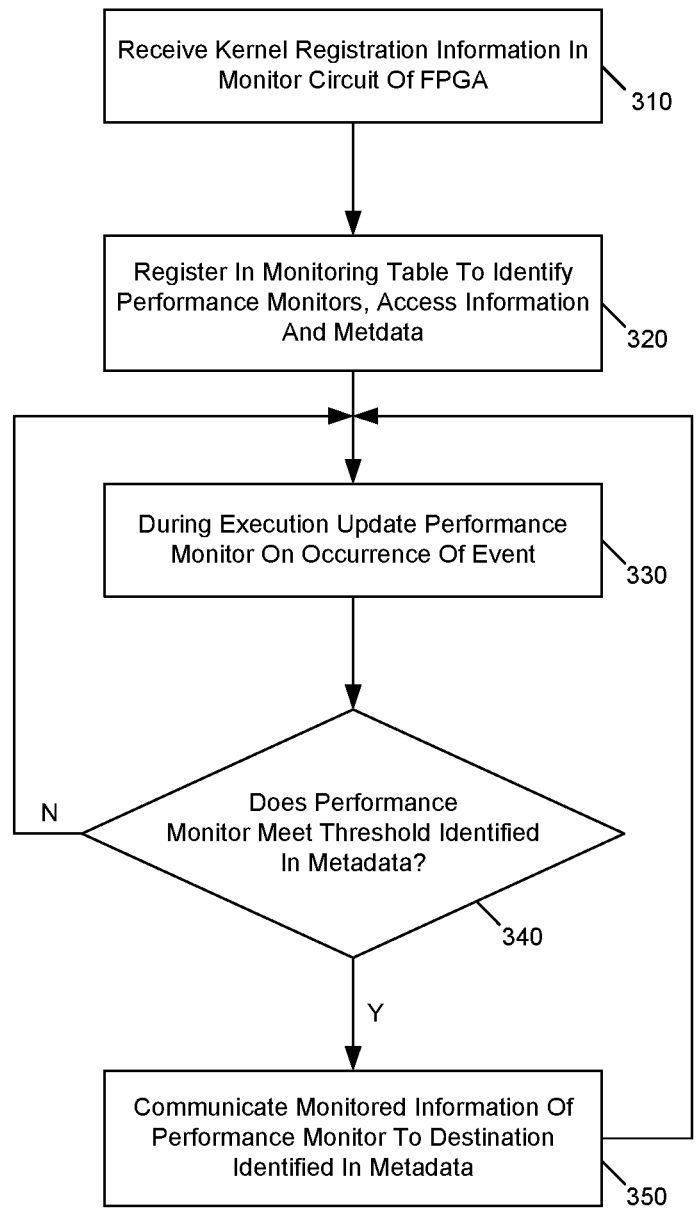
FIG. 3 is a flow diagram of a method in accordance with an embodiment of the present invention.

Referring now to FIG. 3, shown is a flow diagram of a method in accordance with an embodiment of the present invention. Method 300 of FIG. 3 may be performed within an FPGA as described herein. More specifically, control circuitry of the FPGA (including integrated multi-kernel monitoring logic) may perform method 300 to program performance monitoring circuitry of the FPGA based on registration information received from a kernel, update such performance monitors during execution of the kernel on the FPGA, and provide a communication mechanism to communicate performance monitoring information from these performance monitors to a processor, e.g., within a processing node with the FPGA. To this end, the performance monitoring logic may include hardware circuitry, software, firmware and/or combinations thereof to perform the operations.

As illustrated, method 300 begins by receiving kernel registration information in a monitor circuit of the FPGA (block 310). In an embodiment, this kernel registration information is received from the kernel itself as part of a bitstream communicated from a processor or other location to the FPGA. In many cases, this kernel registration information may be provided within the kernel during programming of the FPGA logic to be configured for performing requested operations. Still with reference to FIG. 3, control next passes to block 320 where the monitor circuit may perform various registration activities based on this kernel registration information. More specifically as shown in FIG. 3, the monitor circuit may register information in a monitoring table. This monitoring table may store various information. For example, multiple entries may be provided to identify a kernel, corresponding performance monitor of the FPGA, access information (namely how performance monitoring information of the given performance monitor is to be exposed to a processing node or application executing thereon) and metadata, which may indicate programming criteria of the corresponding performance monitor (e.g., what is being counted, and how the performance monitor is to be updated). In some cases, a single monitoring table may be provided to store all of this information. In other cases, separate tables may be provided, including a registration table and a metadata table. At this point, the performance monitors are appropriately programmed for a kernel, and normal execution of the kernel on the FPGA may begin.

Thus as further illustrated in FIG. 3, control next passes to block 330, where a performance monitor is updated upon occurrence of a given event during execution of the kernel on the FPGA. For example, assume that a first performance monitor dynamically programmed for the kernel is to count a number of multiplications that occur. When a multiplication event occurs during kernel execution, the corresponding performance monitor may be updated, e.g., by the monitor circuit.

To provide seamless and integrated reporting to, e.g., an application executing on the host processor, control next passes to diamond 340 to determine whether the performance monitor meets a threshold identified, e.g., in the metadata associated with the performance monitor. For example, the metadata may provide a reporting threshold that indicates when a value of the performance monitor is to be communicated to the host processor. Continuing with the above example, assume that the metadata indicates that a report is to occur after 10,000 multiplication operations. Thus in this case the determination at diamond 340 causes a loop back to block 330 until the count reaches this threshold number of 10,000.

When it does, control next passes to block 350 where the monitored information may be communicated to an indicated destination. This destination also may be identified in the metadata associated with the given performance monitor. While different examples are possible, in some cases the metadata may indicate that the information is to be pushed to the destination when the threshold is reached. This destination location may vary based on programming. For example, the monitored information may be provided directly to a correlation performance monitor within the host processor, while in other cases the monitored information instead may be provided to a memory location.

Note that this discussion of kernel execution-time updates and reporting is for a single performance monitor of potentially many different performance monitors dynamically programmed for the kernel. As such, the same updating and reporting mechanisms of blocks 330-350 may be performed for each such monitor programmed for a given kernel. Understand while shown at this high level in the embodiment of FIG. 3, many variations and alternatives are possible.

Figure 4:
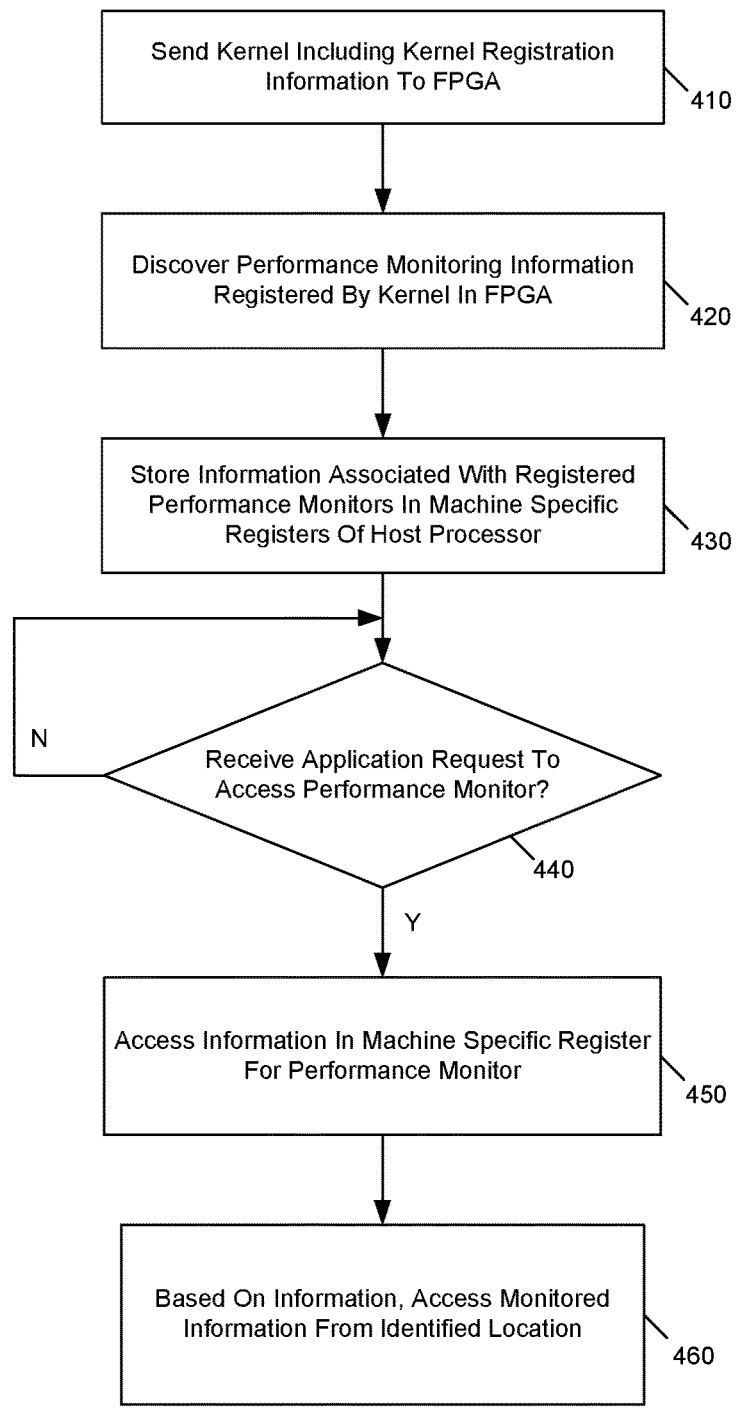
FIG. 4 is a flow diagram of a method in accordance with another embodiment of the present invention.

Referring now to FIG. 4, shown is a flow diagram of a method in accordance with another embodiment of the present invention. More specifically, method 400 of FIG. 4 may be performed within a host processor as described herein. More specifically, control circuitry of the host processor (which may be implemented in one or more cores of the processor) may perform method 400 to interact with FPGA performance monitoring circuitry of the FPGA, discover such performance monitors, and enable an application to receive performance monitoring information from these performance monitors. To this end, the host processor may include hardware circuitry, software, firmware and/or combinations thereof to perform the operations, such as one or more cores of the host processor (along with its own performance monitoring circuitry).

As illustrated, method 400 begins by sending a kernel (including kernel registration information, as discussed above) to an FPGA (block 410). In some cases, an application that executes on a processor may generate one or more kernels to be sent to program the FPGA for executing, e.g., specialized operations, to offload these operations to the FPGA.

Next, at block 420 performance monitoring information registered by the kernel can be discovered. In different embodiments, a processor (or application executing thereon) can discover this performance monitoring information in different ways. Next, control passes to block 430 where discovered information associated with the registered performance monitors can be stored in machine specific registers of the host processor. Note that these MSRs of the host processor are distinct from other MSRs configured for storage of other configuration information of the host processor. Instead these specific MSRs are dedicated for storage of information to identify a set of performance monitors of the performance monitoring circuit of an FPGA that may be associated with one or more kernels undergoing execution on the FPGA. At this point, the host processor is configured with information to enable identification of performance monitors within an FPGA as described herein.

Still with reference to FIG. 4, during normal operation the host processor may receive an application request to access at least one of these performance monitors (as determined at diamond 440). When an application seeks to access a given performance monitor, at block 450 information associated with this performance monitor can be accessed in a corresponding MSR. Understand that the information stored in this MSR can be used to identify the performance monitor within the performance monitoring circuit of the FPGA, the type of information stored in this performance monitor and how to access it. Based on this information, at block 460 the monitored information can be accessed from an identified location. That is, the MSR can indicate from where the performance monitoring information may be obtained. In some cases, a correlation performance monitor within the host processor may provide this monitored information. In other cases, the monitored information may be stored in a given location within a memory. In still other cases, the host processor may issue a request to monitoring logic of the FPGA to cause the monitored information stored in the given performance monitor of the FPGA to be obtained. Understand while shown at this high level in the embodiment of FIG. 4, many variations and alternatives are possible.

With the techniques described herein, a full view of execution of an application on a processing node including an integrated processor and FPGA can be obtained, which provides much greater visibility into their interaction, in contrast to fixed performance counters of an FPGA that collect only predefined information.

Embodiments thus enable heightened processing node integration by providing an enhanced monitoring capability to enable a kernel to register dynamically one or more performance monitors, expose metadata associated with the monitor(s), and enable their collection and use, e.g., with processor performance monitoring facilities to expose them. In addition a software stack can dynamically discover what data is exposed by each kernel running on the FPGA, as well as how it is exposed. Embodiments also enable FPGA monitoring logic to populate a set of processor performance monitors, to enable legacy tools and applications to transparently access these capabilities.

Figure 5:
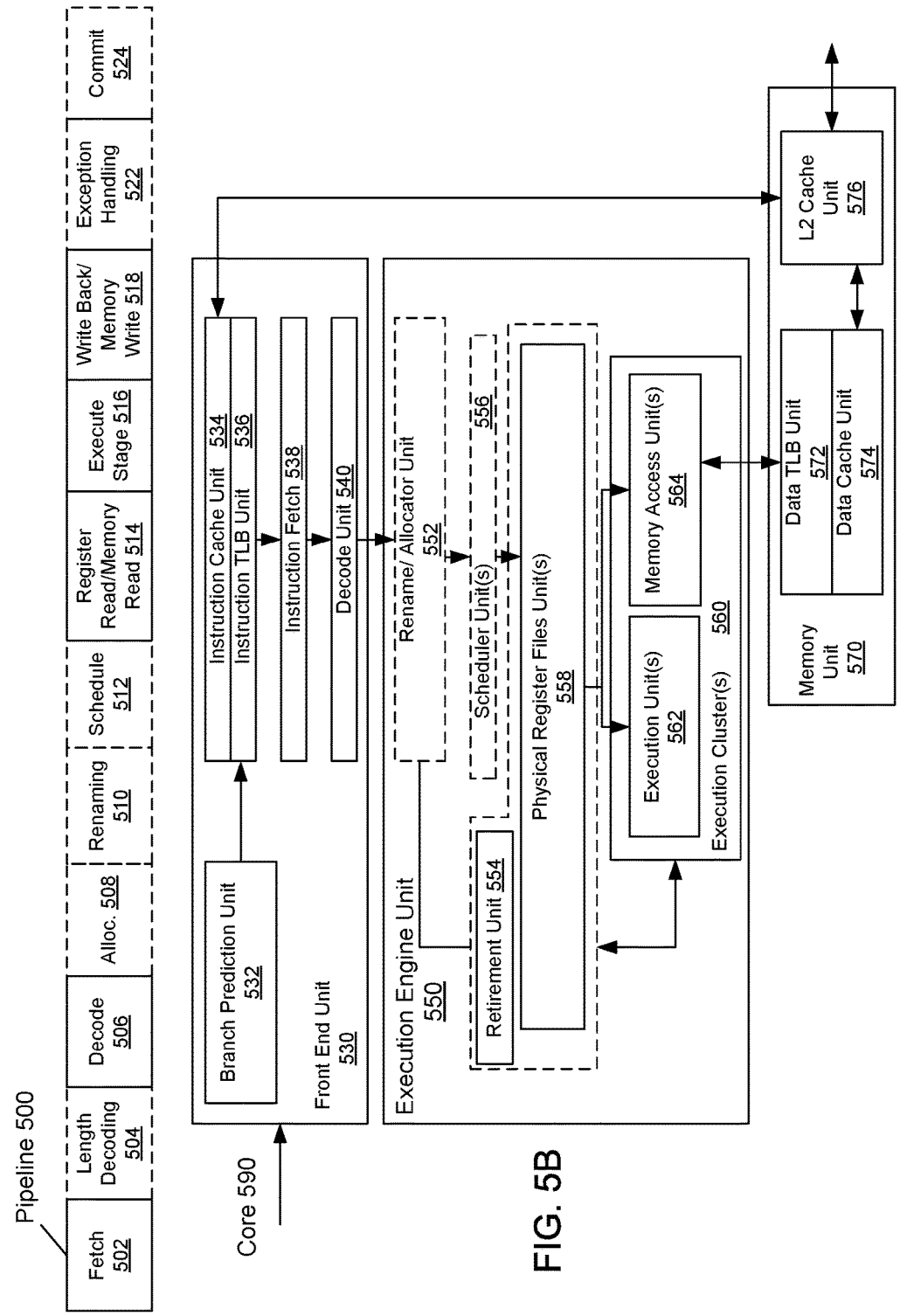
FIG. 5A is a block diagram of an exemplary in-order pipeline and an exemplary register renaming, out-of-order issue/execution pipeline to be included in a processor according to embodiments of the invention.
FIG. 5B is a block diagram illustrating both an exemplary embodiment of an in-order architecture core and an exemplary register renaming, out-of-order issue/execution architecture core to be included in a processor according to embodiments of the invention.

FIG. 5A is a block diagram illustrating both an exemplary in-order pipeline and an exemplary register renaming, out-of-order issue/execution pipeline to be included in a processor according to embodiments of the present invention. FIG. 5B is a block diagram illustrating both an exemplary embodiment of an in-order architecture core and an exemplary register renaming, out-of-order issue/execution architecture core to be included in a processor according to embodiments of the present invention. The solid lined boxes in FIGS. 5A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 5A, a processor pipeline 500 includes a fetch stage 502, a length decode stage 504, a decode stage 506, an allocation stage 508, a renaming stage 510, a scheduling (also known as a dispatch or issue) stage 512, a register read/memory read stage 514, an execute stage 516, a write back/memory write stage 518, an exception handling stage 522, and a commit stage 524.

FIG. 5B shows processor core 590 including a front end unit 530 coupled to an execution engine unit 550, and both are coupled to a memory unit 570. The core 590 may be a reduced instruction set computing (RISC) core, a complex instruction set computing (CISC) core, a very long instruction word (VLIW) core, or a hybrid or alternative core type. As yet another option, the core 590 may be a special-purpose core, such as, for example, a network or communication core, compression engine, coprocessor core, general purpose computing graphics processing unit (GPGPU) core, graphics core, or the like. Understand also that the core 590 may be one of multiple cores that couple to a processor node-included FPGA as described herein.

The front end unit 530 includes a branch prediction unit 532 coupled to an instruction cache unit 534, which is coupled to an instruction translation lookaside buffer (TLB) 536, which is coupled to an instruction fetch unit 538, which is coupled to a decode unit 540. The decode unit 540 (or decoder) may decode instructions, and generate as an output one or more micro-operations, micro-code entry points, microinstructions, other instructions, or other control signals, which are decoded from, or which otherwise reflect, or are derived from, the original instructions. The decode unit 540 may be implemented using various different mechanisms. Examples of suitable mechanisms include, but are not limited to, look-up tables, hardware implementations, programmable logic arrays (PLAs), microcode read only memories (ROMs), etc. In one embodiment, the core 590 includes a microcode ROM or other medium that stores microcode for certain macroinstructions (e.g., in decode unit 540 or otherwise within the front end unit 530). The decode unit 540 is coupled to a rename/allocator unit 552 in the execution engine unit 550.

The execution engine unit 550 includes the rename/allocator unit 552 coupled to a retirement unit 554 and a set of one or more scheduler unit(s) 556. The scheduler unit(s) 556 represents any number of different schedulers, including reservations stations, central instruction window, etc. The scheduler unit(s) 556 is coupled to the physical register file(s) unit(s) 558. Each of the physical register file(s) unit(s)

558 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 558 comprises a vector register unit, a write mask register unit, and a scalar register unit. These register units may provide architectural vector registers, vector mask registers, and general purpose registers. The physical register file(s) unit(s) 558 is overlapped by the retirement unit 554 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 554 and the physical register file unit(s) 558 are coupled to the execution cluster(s) 560. The execution cluster(s) 560 includes a set of one or more execution units 562 and a set of one or more memory access units 564. The execution units 562 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 556, physical register file(s) unit(s) 558, and execution cluster(s) 560 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 564). It should also be understood that where separate pipelines are used, one or more of these pipelines may be out-of-order issue/execution and the rest in-order.

The set of memory access units 564 is coupled to the memory unit 570, which includes a data TLB unit 572 coupled to a data cache unit 574 coupled to a level 2 (L2) cache unit 576. Instruction cache unit 534 and data cache unit 574 may together be considered to be a distributed L1 cache. In one exemplary embodiment, the memory access units 564 may include a load unit, a store address unit, and a store data unit, each of which is coupled to the data TLB unit 572 in the memory unit 570. The instruction cache unit 534 is further coupled to a level 2 (L2) cache unit 576 in the memory unit 570. The L2 cache unit 576 may be coupled to one or more other levels of cache and eventually to a main memory.

By way of example, the exemplary register renaming, out-of-order issue/execution core architecture may implement the pipeline 500 as follows: 1) the instruction fetch unit 538 performs the fetch and length decoding stages 502 and 504; 2) the decode unit 540 performs the decode stage 506; 3) the rename/allocator unit 552 performs the allocation stage 508 and renaming stage 510; 4) the scheduler unit(s) 556 performs the schedule stage 512; 5) the physical register file unit(s) 558 and the memory unit 570 perform the register read/memory read stage 514; the execution cluster 560 perform the execute stage 516; 6) the memory unit 570 and the physical register file(s) unit(s) 558 perform the write back/memory write stage 518; 7) various units may be involved in the exception handling stage 522; and 8) the retirement unit 554 and the physical register file(s) unit(s) 558 perform the commit stage 524.

The core 590 may support one or more instructions sets (e.g., the x86 instruction set (with some extensions that have been added with newer versions); the MIPS instruction set developed by MIPS Technologies of Sunnyvale, Calif.; the ARM instruction set (with optional additional extensions such as NEON) of ARM Holdings of Sunnyvale, Calif.), including the instruction(s) described herein. In one embodiment, the core 590 includes logic to support a packed data instruction set extension (e.g., AVX1, AVX2, and/or some form of the generic vector friendly instruction format (U=0 and/or U=1)), thereby allowing the operations used by many multimedia applications to be performed using packed data. Note that the core 590 may send kernels including kernel registration information to a FPGA to enable programming of dynamic performance monitors of the FPGA, as described herein.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 534/574 and a shared L2 cache unit 576, alternative embodiments may have a single internal cache for both instructions and data, such as, for example, a L1 internal cache, or multiple levels of internal cache. In some embodiments, the system may include a combination of an internal cache and an external cache that is external to the core and/or the processor. Alternatively, all of the caches may be external to the core and/or the processor.

Figure 6:
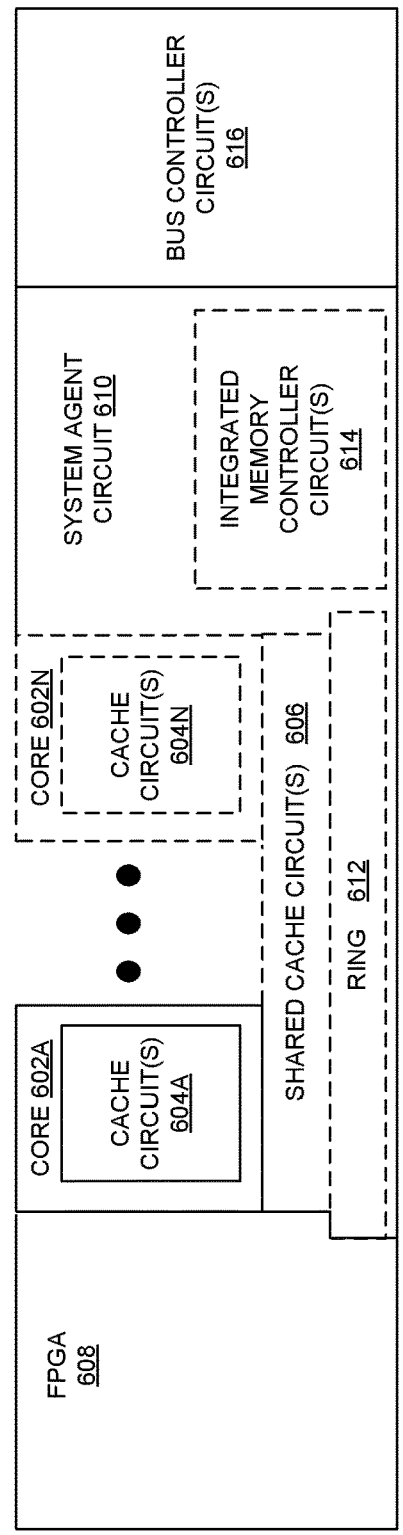
FIG. 6 is a block diagram of a single core processor and a multicore processor with a FPGA according to embodiments of the invention.

FIG. 6 is a block diagram of a processor node 600 that may have more than one core, a FPGA, an integrated memory controller, and integrated graphics according to embodiments of the invention. The solid lined boxes in FIG. 6 illustrate a processor 600 with a single core 602A, a system agent circuit 610, a set of one or more bus controller circuits 616, while the optional addition of the dashed lined boxes illustrates an alternative processor 600 with multiple cores 602A-N, and a set of one or more integrated memory controller circuit(s) 614 in the system agent circuit 610. As further illustrated in FIG. 6, processor 600 also includes a FPGA 608 as described herein, which may be leveraged by one or more of cores 602A-602N. In some cases, FPGA 608 may include dynamic performance monitoring circuitry to be programmed by a kernel as described herein.

Processor 600 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, accelerator device, or the like. The processor may be implemented on one or more chips. The processor 600 may be a part of and/or may be implemented on one or more substrates using any of a number of process technologies, such as, for example, BiCMOS, CMOS, or NMOS.

The memory hierarchy includes one or more levels of cache circuits 604A-N (including L1 cache) within the cores 602A-N, a set of one or more shared cache circuits 1006, and external memory (not shown) coupled to the set of integrated memory controller circuits 614. The set of shared cache circuits 606 may include one or more mid-level caches, such as level 2 (L2), level 3 (L3), level 4 (L4), or other levels of cache, a last level cache (LLC), and/or combinations thereof. While in one embodiment a ring-based interconnect circuit 612 interconnects FPGA 608, the set of shared cache units 606, and the system agent circuit 610/integrated memory controller circuit(s) 614, alternative embodiments may use any number of well-known techniques for interconnecting such circuits. In one embodiment, coherency is maintained between one or more cache circuit 606 and cores 602A-N.

In some embodiments, one or more of the cores 602A-N are capable of multithreading. The system agent circuit 610 includes those components coordinating and operating cores 602A-N. The system agent circuit 610 may include for example a power control unit (PCU) and a display unit. The PCU may be or include logic and components needed for regulating the power state of the cores 602A-N and the FPGA 608. The display unit may be for driving one or more externally connected displays.

The cores 602A-N may be homogenous or heterogeneous in terms of architecture instruction set; that is, two or more of the cores 602A-N may be capable of execution of the same instruction set, while others may be capable of executing only a subset of that instruction set or a different instruction set. In one embodiment, the cores 602A-N are heterogeneous and include both the "small" cores and "big" cores described below.

Figure 7:
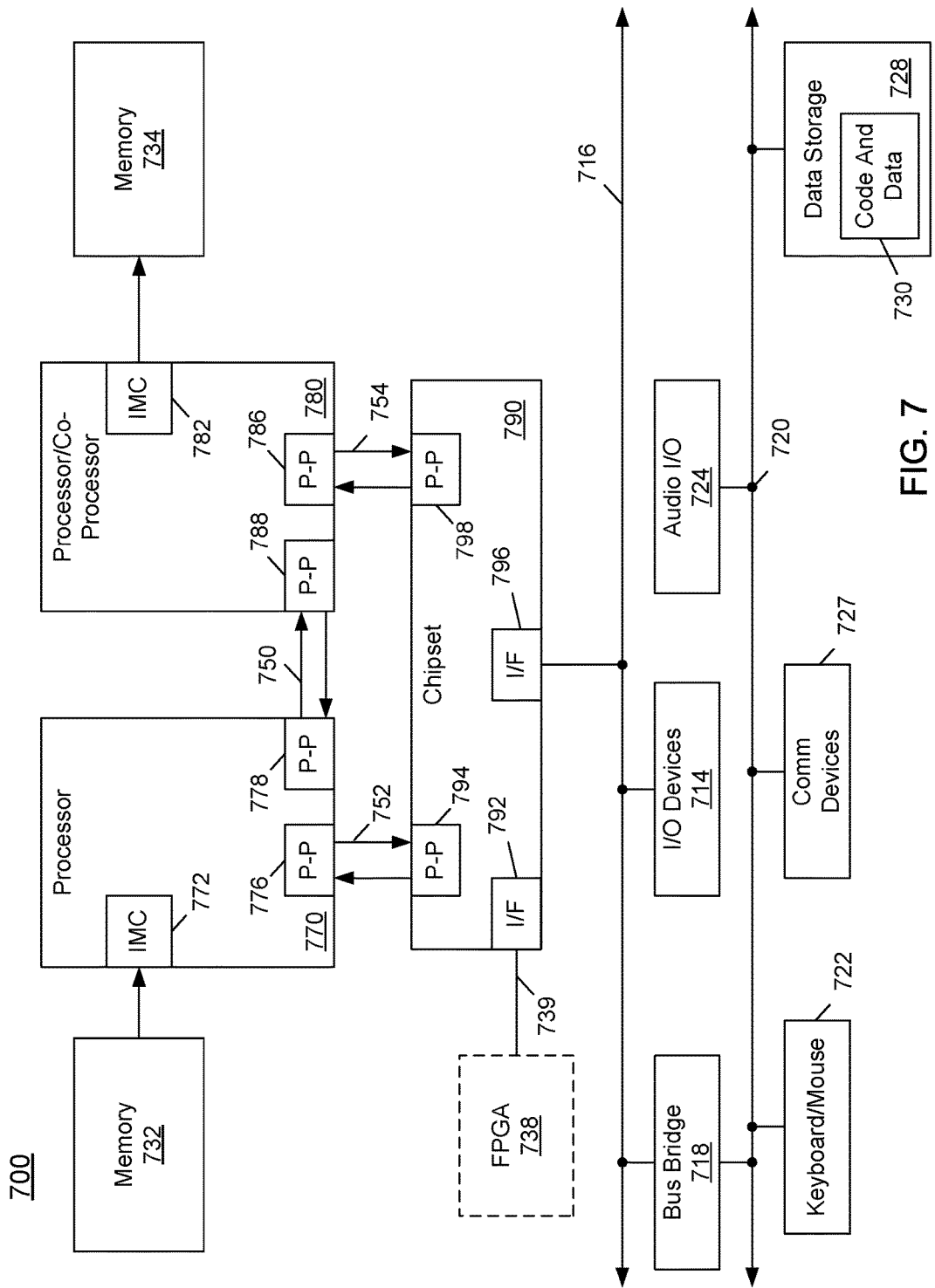
FIG. 7 illustrates a block diagram of a system in accordance with an embodiment of the present invention.

FIG. 7 is block diagram of an exemplary computer architecture. Other system designs and configurations known in the arts for laptops, desktops, tablets, handheld PCs, personal digital assistants, engineering workstations, servers, network devices, network hubs, switches, embedded processors, digital signal processors (DSPs), graphics devices, video game devices, set-top boxes, micro controllers, cell phones, smartphones, portable media players, hand held devices, and various other electronic devices, are also suitable. In general, a huge variety of systems or electronic devices capable of incorporating a processor and/or other execution logic as disclosed herein are generally suitable.

Referring now to FIG. 7, shown is a block diagram of an exemplary system 700 in accordance with an embodiment of the present invention. As shown in FIG. 7, multiprocessor system 700 is a point-to-point interconnect system, and includes a first processor 770 and a second processor 780 coupled via a point-to-point interconnect 750. Each of processors 770 and 780 may be some version of the processor 600 of FIG. 6.

Processors 770 and 780 are shown including integrated memory controller (IMC) units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may optionally exchange information with a FPGA 738 via a high-performance interface 739 using point-to-point interface circuit 792. In one embodiment, the FPGA 738 includes performance monitoring circuitry to be dynamically programmed by a kernel received from one or more of processors 770, 780. Understand that in other embodiments, FPGA 738 may be directly coupled to one or more of the processors 770, 780.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present invention is not so limited.

As shown in FIG. 7, various I/O devices 714 may be coupled to first bus 716, along with a bus bridge 718 which couples first bus 716 to a second bus 720. In one embodiment, one or more additional processor(s) 715, such as coprocessors, high-throughput MIC processors, GPGPU's, accelerators (such as, e.g., graphics accelerators or digital signal processing (DSP) units), field programmable gate arrays, or any other processor, are coupled to first bus 716. In one embodiment, second bus 720 may be a low pin count (LPC) bus. Various devices may be coupled to a second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to the second bus 720. Note that other architectures are possible. For example, instead of the point-to-point architecture of FIG. 7, a system may implement a multi-drop bus or other such architecture.

Figure 8:
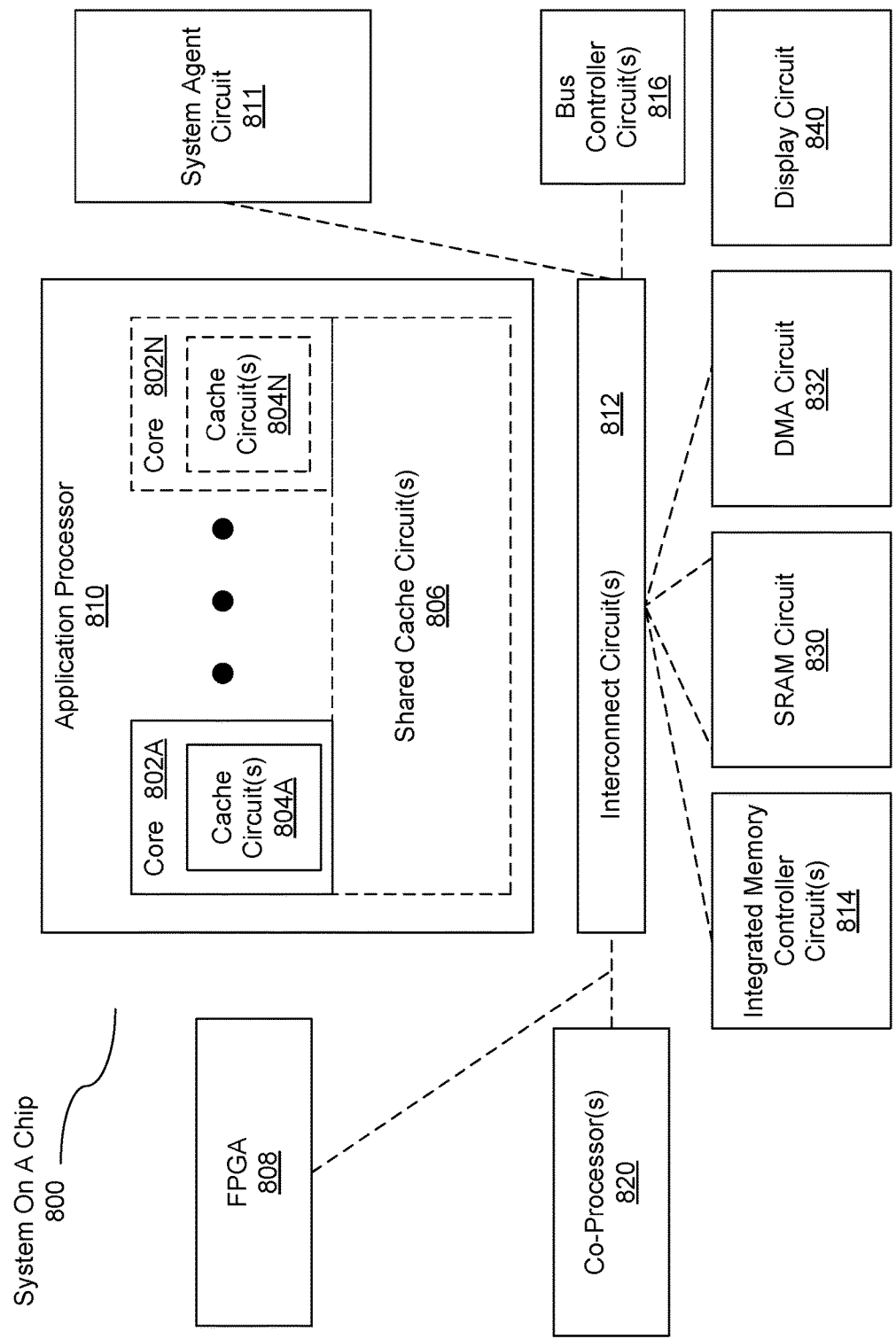
FIG. 8 illustrates a block diagram of a system on a chip (SoC) in accordance with an embodiment of the present invention.

Referring now to FIG. 8, shown is a block diagram of a SoC 800 in accordance with an embodiment of the present invention. Also, dashed lined boxes are optional features on more advanced SoCs. In FIG. 8, an interconnect circuit(s) 812 is coupled to: an application processor 810 which includes a set of one or more cores 802A-N having cache circuit(s) 804A-804N, and shared cache circuit(s) 806; a FPGA 808 as described herein which may be shared and dynamically programmed by multiple ones of cores 802A-802N; a system agent circuit 811; a bus controller circuit(s) 816; an integrated memory controller circuit(s) 814; a set of one or more coprocessors 820 which may include integrated graphics logic, an image processor, an audio processor, and a video processor; a static random access memory (SRAM) circuit 830; a direct memory access (DMA) circuit 832; and a display circuit 840 for coupling to one or more external displays. In one embodiment, the coprocessor(s) 820 include a special-purpose processor, such as, for example, a network or communication processor, compression engine, GPGPU, a high-throughput MIC processor, embedded processor, or the like.

Program code, such as code 730 illustrated in FIG. 7, may include one or more kernels having kernel registration information to enable dynamic programming of performance monitoring circuitry of a FPGA as described herein. The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a non-transitory machine-readable medium which represents various logic within the processor, which when read by a machine causes the machine to fabricate logic to perform the techniques described herein. Such representations, known as "IP cores" may be stored on a tangible non-transitory, machine readable medium and supplied to various customers or manufacturing facilities to load into the fabrication machines that actually make the logic or processor. Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 9:
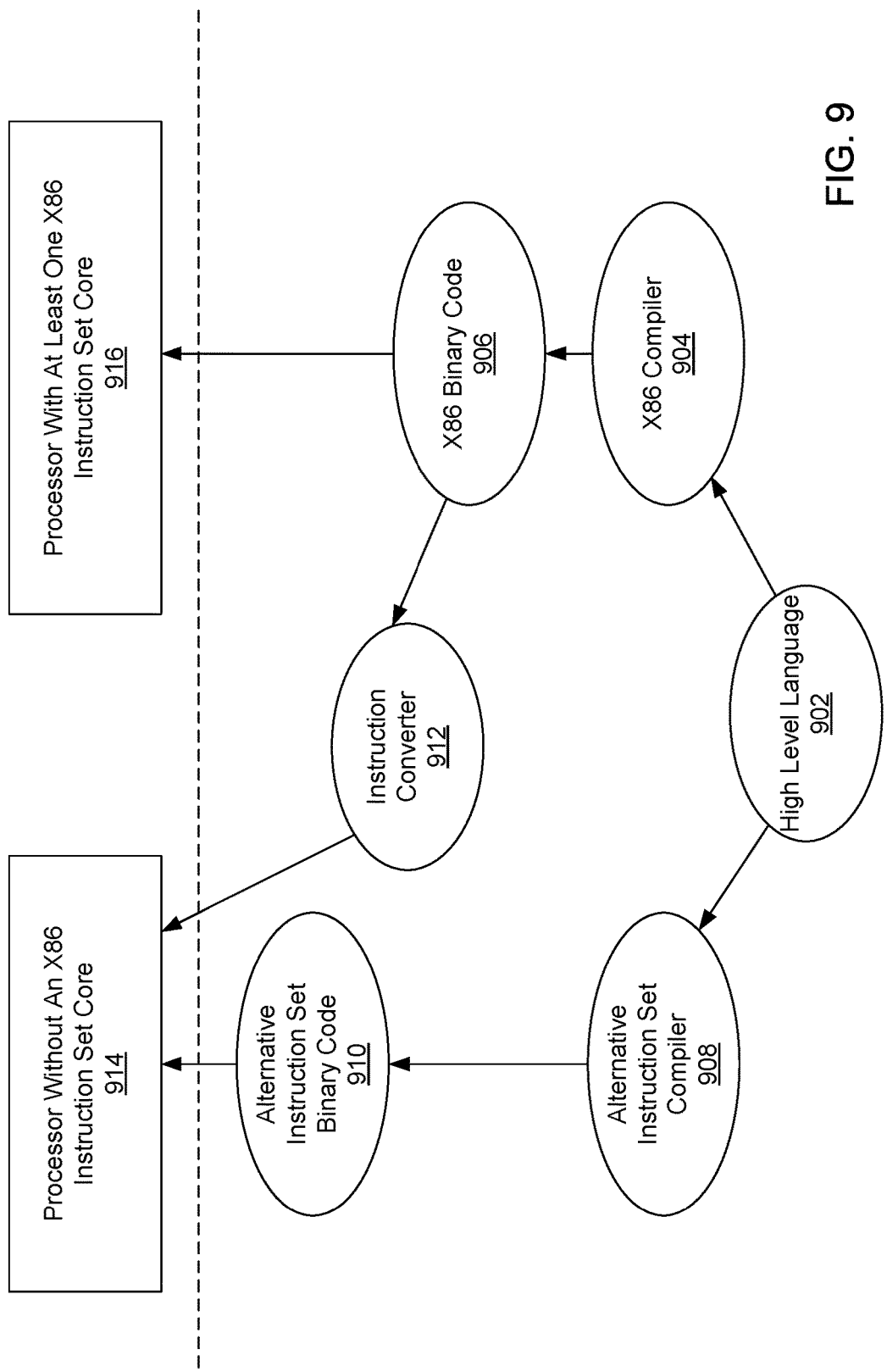
FIG. 9 illustrates a block diagram contrasting the use of a software instruction converter to convert binary instructions in a source instruction set to binary instructions in a target instruction set according to embodiments of the invention.

FIG. 9 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 9 shows a program in a high level language 902 may be compiled using an x86 compiler 904 to generate x86 binary code 906 that may be natively executed by a processor with at least one x86 instruction set core 916. The processor with at least one x86 instruction set core 916 represents any processor that can perform substantially the same functions as an Intel processor with at least one x86 instruction set core by compatibly executing or otherwise processing (1) a substantial portion of the instruction set of the Intel® x86 instruction set core or (2) object code versions of applications or other software targeted to run on an Intel processor with at least one x86 instruction set core, in order to achieve substantially the same result as an Intel® processor with at least one x86 instruction set core. The x86 compiler 904 represents a compiler that is operable to generate x86 binary code 906 (e.g., object code) that can, with or without additional linkage processing, be executed on the processor with at least one x86 instruction set core 916. Similarly, FIG. 9 shows the program in the high level language 902 may be compiled using an alternative instruction set compiler 908 to generate alternative instruction set binary code 910 that may be natively executed by a processor without at least one x86 instruction set core 914 (e.g., a processor with cores that execute the MIPS instruction set of MIPS Technologies of Sunnyvale, Calif. and/or that execute the ARM instruction set of ARM Holdings of Sunnyvale, Calif.). The instruction converter 912 is used to convert the x86 binary code 906 into code that may be natively executed by the processor without an x86 instruction set core 914. This converted code is not likely to be the same as the alternative instruction set binary code 910 because an instruction converter capable of this is difficult to make; however, the converted code will accomplish the general operation and be made up of instructions from the alternative instruction set. Thus, the instruction converter 912 represents software, firmware, hardware, or a combination thereof that, through emulation, simulation or any other process, allows a processor or other electronic device that does not have an x86 instruction set processor or core to execute the x86 binary code 906.

The following examples pertain to further embodiments.

In one example, an apparatus comprises: a FPGA including: programmable logic to perform at least one function for a processor coupled to the FPGA; a performance monitor circuit including a plurality of performance monitors, where a first set of performance monitors of the plurality of performance monitors is to be programmably associated with a first kernel of a plurality of kernels to execute on the FPGA; and a monitor circuit to receive kernel registration information of the first kernel from the processor and program at least one of the first set of performance monitors for association with the first kernel based on the kernel registration information.

In an example, the FPGA further comprises a monitor table including a plurality of entries each to store a kernel identifier for a kernel, a performance monitor identifier for a performance monitor of the plurality of performance monitors, and access information to indicate how to expose the performance monitor to the processor.

In an example, the FPGA further comprises a metadata table including a plurality of entries each to store a kernel identifier for a kernel, a performance monitor identifier for a performance monitor of the plurality of performance monitors, and a metadata field to store metadata to indicate at least one programmable characteristic of the performance monitor.

In an example, the monitor circuit is to communicate monitored information stored in a first performance monitor of the first set of performance monitors to a location in a memory, where an address of the location is stored in the access information of an entry of the monitor table associated with the first performance monitor.

In an example, the monitor circuit is to communicate the monitored information to the location in the memory in response to a value of the monitored information matching a value stored in the metadata.

In an example, the first kernel is to update the first performance monitor in response to a first event that occurs during execution of the first kernel on the FPGA.

In an example, the processor comprises a set of registers to store identification information regarding the plurality of performance monitors and a kernel that programmed the plurality of performance monitors.

In an example, the processor further comprises a correlation performance monitor circuit to store performance monitor information from the plurality of performance monitors.

In an example, in response to a request from an application, the processor is to discover the first set of performance monitors associated with the first kernel and store information regarding the first set of performance monitors into one or more machine specific registers of the processor.

In an example, the apparatus comprises a processing node including the FPGA and the processor, the processor comprising a multi-core processor.

In another example, a method comprises: receiving kernel registration information of a first kernel in a monitor circuit of a FPGA, the kernel registration information including programming information for a plurality of performance monitors of a performance monitoring circuit of the FPGA; registering at least a portion of the programming information in a monitoring table of the FPGA to associate the plurality of performance monitors with the first kernel; and updating a first performance monitor of the plurality of performance monitors responsive to a first event during execution of the first kernel on the FPGA, based at least in part on the programming information.

In an example, the method further comprises: determining whether a value stored in the first performance monitor meets a threshold value indicated in the programming information; and responsive to the value meeting the threshold, communicating the value to a destination identified in the programming information.

In an example, the destination comprises a location in a memory coupled to the FPGA, an address of the location in the memory identified in the programming information.

In an example, the destination comprises a first correlation performance monitor in a host processor coupled to the FPGA, the first correlation performance monitor identified in the programming information.

In an example, the method further comprises: receiving a discovery request from an application in execution on a host processor coupled to the FPGA; communicating at least some of the programming information to the host processor.

In an example, the first event comprises a kernel-specific event.

In an example, the method further comprises storing metadata corresponding to at least one monitoring characteristic of the first performance monitor in a metadata table of the FPGA.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In another example, a computing system comprises: an FPGA and a processor. The FPGA may include: programmable logic to execute a first kernel associated with an application to execute on the processor; a performance monitor circuit including a first set of performance monitors to be programmably associated with the first kernel; and a monitor circuit to receive kernel registration information of the first kernel and program the first set of performance monitors for association with the first kernel based on the kernel registration information. The processor may include: a plurality of cores; at least one performance monitor to store performance monitor information from the FPGA; and a set of registers to store metadata associated with the first set of performance monitors of the performance monitor circuit of the FPGA.

In an example, a first performance monitor of the performance monitor circuit of the FPGA is to store information regarding operation in a first state of a finite state machine of the programmable logic of the FPGA during execution of the first kernel.

In an example, the monitor circuit is to communicate monitored information stored in a first performance monitor of the first set of performance monitors to the at least one performance monitor of the processor, based on the kernel registration information.

In yet another example, an apparatus comprises a FPGA that includes: programmable means for performing at least one function for a processor coupled to the FPGA; performance monitoring means including a plurality of sets of performance monitors, where a first set of performance monitors of the plurality of performance monitors is to be programmably associated with a first kernel of a plurality of kernels to execute on the FPGA; and monitor means for receiving kernel registration information of the first kernel from the processor and for programming at least one of the first set of performance monitors for association with the first kernel based on the kernel registration information.

In an example, the FPGA further comprises monitor table means including a plurality of entries each to store a kernel identifier for a kernel, a performance monitor identifier for a performance monitor of the plurality of performance monitors, and access information to indicate how to expose the performance monitor to the processor.

In an example, the FPGA further comprises a metadata table means including a plurality of entries each to store a kernel identifier for a kernel, a performance monitor identifier for a performance monitor of the plurality of performance monitors, and a metadata field to store metadata to indicate at least one programmable characteristic of the performance monitor.

In an example, the monitor means is to communicate monitored information stored in a first performance monitor of the first set of performance monitors to a location in a memory, where an address of the location is stored in the access information of an entry of the monitor table means associated with the first performance monitor.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a field programmable gate array (FPGA) comprising:
        hardware programmable logic to perform at least one function for a processor coupled to the FPGA;
        a hardware performance monitor circuit including a plurality of performance monitors, wherein a first set of performance monitors of the plurality of performance monitors is to be programmably associated with a first kernel of a plurality of kernels to execute on the FPGA to obtain performance information regarding interaction between the processor and the FPGA; and
        a hardware monitor circuit to receive kernel registration information of the first kernel from the processor and program at least one of the first set of performance monitors for association with the first kernel based on the kernel registration information to obtain monitored information corresponding to the performance information regarding the interaction between the processor and the FPGA and communicate the monitored information to the processor to enable the processor to observe and analyze the monitored information.

2. The apparatus of claim 1, wherein the FPGA further comprises a monitor table including a plurality of entries each to store a kernel identifier for a kernel, a performance monitor identifier for a performance monitor of the plurality of performance monitors, and access information to indicate how to expose the performance monitor to the processor.

3. The apparatus of claim 2, wherein the FPGA further comprises a metadata table including a plurality of entries each to store a kernel identifier for a kernel, a performance monitor identifier for a performance monitor of the plurality of performance monitors, and a metadata field to store metadata to indicate at least one programmable characteristic of the performance monitor.

4. The apparatus of claim 2, wherein the hardware monitor circuit is to communicate the monitored information stored in a first performance monitor of the first set of performance monitors to a location in a memory, wherein an address of the location is stored in the access information of an entry of the monitor table associated with the first performance monitor.

5. The apparatus of claim 4, wherein the first kernel is to update the first performance monitor in response to a first event that occurs during execution of the first kernel on the FPGA.

6. The apparatus of claim 1, further comprising the processor, wherein the processor comprises a set of registers to store identification information regarding the plurality of performance monitors and a kernel that programmed the plurality of performance monitors.

7. The apparatus of claim 6, wherein the processor further comprises a correlation performance monitor circuit to store performance monitor information from the plurality of performance monitors.

8. The apparatus of claim 1, further comprising the processor, wherein in response to a request from an application, the processor is to discover the first set of performance monitors associated with the first kernel and store information regarding the first set of performance monitors into one or more machine specific registers of the processor.

9. The apparatus of claim 1, wherein the apparatus comprises a processing node comprising a single package multi-chip module including the FPGA and the processor, the processor comprising a multi-core processor.

10. The apparatus of claim 1, wherein the hardware monitor circuit is to determine whether a value stored in the at least one of the first set of performance monitors meets a threshold value indicated in the kernel registration information, and responsive to the value meeting the threshold value, communicate the value to the processor.

11. A non-transitory machine-readable medium having stored thereon instructions, which if performed by a machine cause the machine to perform a method comprising:
    receiving kernel registration information of a first kernel in a hardware monitor circuit of a field programmable gate array (FPGA), the kernel registration information including programming information for a plurality of performance monitors of a hardware performance monitoring circuit of the FPGA;
    registering at least a portion of the programming information in a monitoring table of the FPGA to associate the plurality of performance monitors with the first kernel; and
    updating a first performance monitor of the plurality of performance monitors responsive to a first event during execution of the first kernel on the FPGA, based at least in part on the programming information.

12. The non-transitory machine-readable medium of claim 11, wherein the method further comprises:
    determining whether a value stored in the first performance monitor meets a threshold value indicated in the programming information; and
    responsive to the value meeting the threshold value, communicating the value to a destination identified in the programming information.

13. The non-transitory machine-readable medium of claim 12, wherein the destination comprises a location in a memory coupled to the FPGA, an address of the location in the memory identified in the programming information.

14. The non-transitory machine-readable medium of claim 12, wherein the destination comprises a first correlation performance monitor in a host processor coupled to the FPGA, the first correlation performance monitor identified in the programming information.

15. The non-transitory machine-readable medium of claim 11, wherein the method further comprises:
    receiving a discovery request from an application in execution on a host processor coupled to the FPGA;
    communicating at least some of the programming information to the host processor.

16. The non-transitory machine-readable medium of claim 11, wherein the method further comprises storing metadata corresponding to at least one monitoring characteristic of the first performance monitor in a metadata table of the FPGA.

17. A computing system comprising:
a field programmable gate array (FPGA) comprising:
hardware programmable logic to execute a first kernel associated with an application to execute on a processor;
a hardware performance monitor circuit including a first set of performance monitors to be programmably associated with the first kernel to obtain performance information regarding interaction between the processor and the FPGA; and
a hardware monitor circuit to receive kernel registration information of the first kernel and program the first set of performance monitors for association with the first kernel based on the kernel registration information to obtain monitored information corresponding to the performance information regarding the interaction between the processor and the FPGA and communicate the monitored information to the processor to enable the processor to observe and analyze the monitored information; and
the processor comprising:
a plurality of cores;
at least one performance monitor to store the monitored information from the FPGA; and
a set of registers to store metadata associated with the first set of performance monitors of the hardware performance monitor circuit of the FPGA.

18. The computing system of claim 17, wherein a first performance monitor of the hardware performance monitor circuit of the FPGA is to store information regarding operation in a first state of a finite state machine of the hardware programmable logic of the FPGA during execution of the first kernel.

19. The computing system of claim 17, wherein the hardware monitor circuit is to communicate the monitored information stored in a first performance monitor of the first set of performance monitors to the at least one performance monitor of the processor, based on the kernel registration information.

20. The computing system of claim 17, wherein the hardware monitor circuit is to determine whether a value stored in a first performance monitor of the first set of performance monitors meets a threshold value indicated in the kernel registration information, and responsive to the value meeting the threshold value, communicate the value to the processor.

\* \* \* \* \*